United States Patent [19]
Meijer

[11] 3,937,989
[45] Feb. 10, 1976

[54] TEMPERATURE DISCRIMINATION APPARATUS

[75] Inventor: Robert S. Meijer, Montreal, Canada

[73] Assignee: Multi-State Devices Ltd., Dorval, Canada

[22] Filed: Dec. 6, 1974

[21] Appl. No.: 530,390

[52] U.S. Cl............... 307/252 B; 219/501; 307/310
[51] Int. Cl.² ........................................ H03K 17/72
[58] Field of Search........ 307/252 B, 310, 232, 234; 73/262 SC; 219/209, 497, 499, 500, 505, 501

[56] References Cited
UNITED STATES PATENTS

| | | |
|---|---|---|
| 3,475,677 | 10/1969 | Swinehart et al. ............... 307/310 X |
| 3,648,074 | 3/1972 | Nurnberg....................... 307/310 X |
| 3,700,933 | 10/1972 | Harkenrider et al. .............. 307/310 |

Primary Examiner—John Zazworsky
Attorney, Agent, or Firm—Spencer & Kaye

[57] ABSTRACT

A temperature discrimination apparatus is disclosed which comprises a first switching device exhibiting regenerative switching action at a power level which is dependent on the temperature sensed by such first switching device, a second switching device exhibiting regenerative switching action solely in response to a pre-selected power level, means connected to the first and second switching devices for determining if the first switching device has switched before the second switching device in the cycle of the a.c. power source as the magnitude of the voltage increases from zero. This will serve as an indication that the temperature to be sensed has been reached.

7 Claims, 4 Drawing Figures

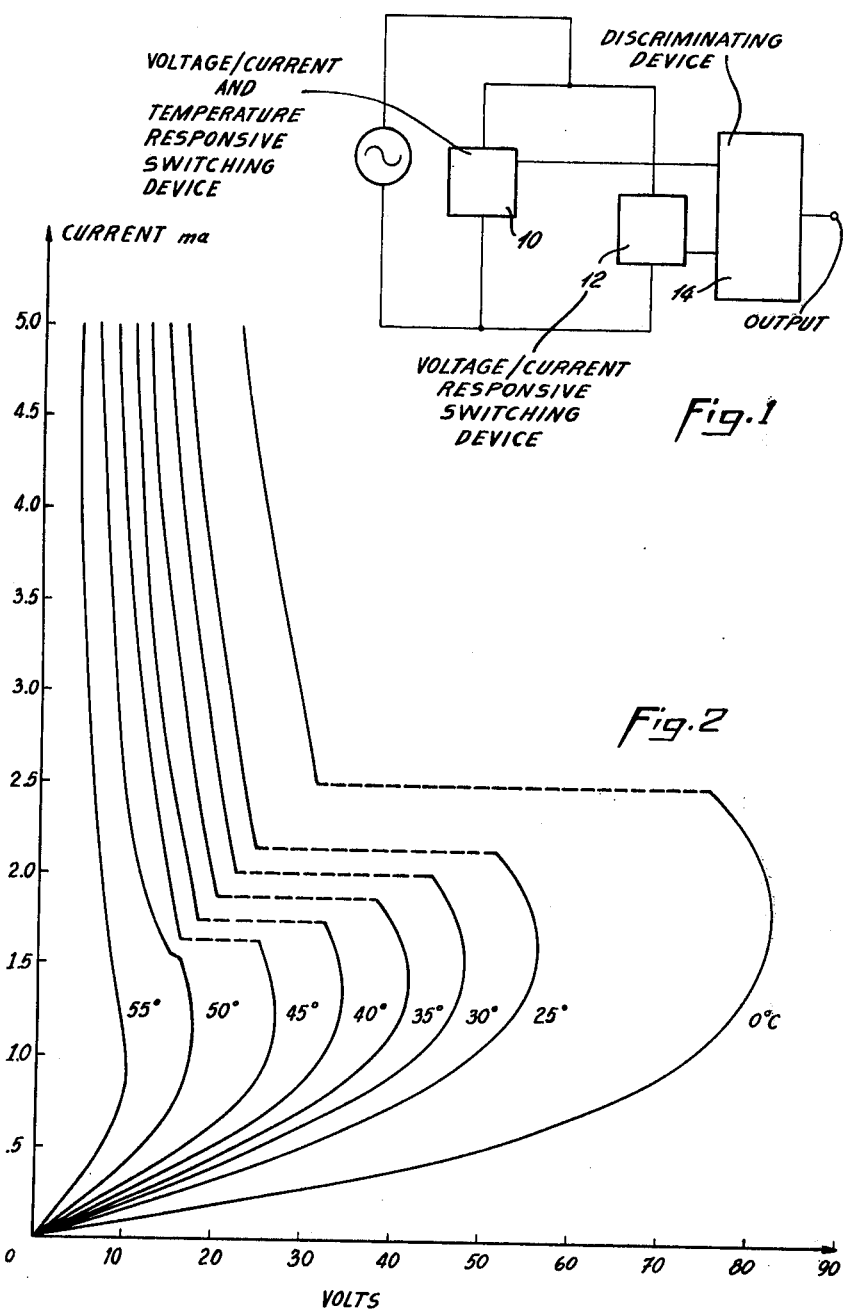

TEMPERATURE DISCRIMINATION APPARATUS

This invention relates to a temperature discrimination apparatus and more particularly to a temperature discrimination apparatus using switching devices showing regenerative switching action.

There are a large number of devices that show regenerative switching action at a specific voltage or current threshold. Some examples are tunnel diodes, four layer switches, amorphous glass devices, gas discharge devices, electro mechanical relays, etc. A substantial number of these devices show switching action in response to both temperature and voltage or current. As a matter of fact, a large number of these devices, such as the amorphous glass devices, transition metal oxides and certain classes of negative temperature coefficient devices, show a regenerative switching action which is strongly dependent on the temperature of the switching device. In most cases, elevated temperatures correspond to reduction in the voltage or current threshold necessary to cause switching.

The expression "temperature dependent regenerative switching devices" as used below means devices exhibiting avalanche behaviour due to their very high negative temperature coefficient of resistance. As commonly known, most thermal avalanche behaviour is due to a current crowding effect in which current crowding leads to local heating in the device which in turn leads to further current crowding. On completion of this process, most of the device current flows through a very narrow filament in the device. Because of the relatively low resistance of the conducting material, total device resistance becomes quite low. Such devices therefore behave like switches and go from a high resistance to a low resistance state in a very short period of time.

The basic switching mechanism of the temperature dependent regenerative switching devices is usually thermal and occurs in response to both joule heating and the ambient thermal energy. In most cases, switching action is observed when the sum of all energies yields a given temperature at the switching element. In other words, whatever the source of heat, the switching device always switches at an essentially fixed temperature. As disclosed in U.S. application Ser. No. 530,389 filed Dec. 6, 1974 by the same assignee as the present application, such devices may advantageously be used as thermostats for sensing ambient temperature or the temperature of a medium. The temperature discriminating ability of the switching device is, however, always dependent on the voltage applied to the device and variations of line voltage will appreciably affect the accuracy of such switching element when used to sense temperature only.

It is therefore the object of the present invention to provide a temperature discrimination apparatus which is substantially independent of line voltage variations and, furthermore, is not sensitive to the inherent hysteresis (dead band) of the known on-off thermostat devices.

The temperature discriminating apparatus, in accordance with the invention, comprises a first switching device exhibiting regenerative switching action at a power level which is dependent on the temperature sensed by such first switching device, a second switching device exhibiting regenerative switching action solely in response to a preselected power level, means for simultaneously feeding power from an a.c. source to both the first and second switching devices, and discriminating means interconnecting the first and second switching devices for determining if the first switching device has switched before the second switching device in the cycle of the a.c. power source as the magnitude of the a.c. source increases from zero, thus providing an indication that the temperature to be sensed has been reached.

The discriminating means may be any well known digital circuit interconnecting the first and second switching devices to detect the firing sequence of the two switching devices to indicate whether or not the temperature exceeds a predetermined threshold.

A resistor is preferably connected in series with the first switching device across the a.c. source and the value of such resistor is selected to insure regenerative switching action at about 90° of the a.c. waveform at the lowest temperature to be sensed and the minimum peak voltage of the source at expected extreme r.m.s. voltage variations. As the sensed temperature increases, the firing angle of the first switching device will move from 90° towards 0° of the a.c. waveform and such variation will be proportional to the temperature.

The above mentioned second switching device may operate at a voltage which is much lower than the one of the a.c. source. In that case, a voltage divider may be connected across such a.c. source and include a resistor for setting the proper voltage for firing the above-mentioned second switching device. Such resistor may be variable so as to manually set such second switching device so that it will turn on at various pre-selected instantaneous values of the source voltage.

In a preferred embodiment of the invention, the first and second switching devices are connected in parallel across the a.c. source and the discriminating means is a diode interconnecting the first and second switching devices and poled in such a direction so as to be reverse biased until the first switching device has switched to its low resistance state but to become forward biased when the first switching device has switched so as to clamp the voltage applied to the second switching device to a value below its switching voltage thereby preventing switching of the second switching device when the first switching device is switched before the second.

The above disclosed discrimination apparatus may be used for firing a triac connected in series with a temperature conditioning element. In a preferred embodiment of the invention, the second switching device may be a silicon unilateral switch which will provide pulses at the output thereof depending on whether the desired temperature has been reached or not. Such pulses may be applied to the gate of a silicon controlled rectifier which in turn will control by a well known gate circuitry the on or off status of the triac.

The invention will now be disclosed, by way of example, with reference to accompanying drawings in which:

FIG. 1 illustrates a block diagram of the temperature discriminating apparatus in accordance with the invention;

FIG. 2 illustrates the temperature dependent current-voltage characteristics of a vanadium oxide device suitable for use as the above-mentioned first switching device;

Figure 3:
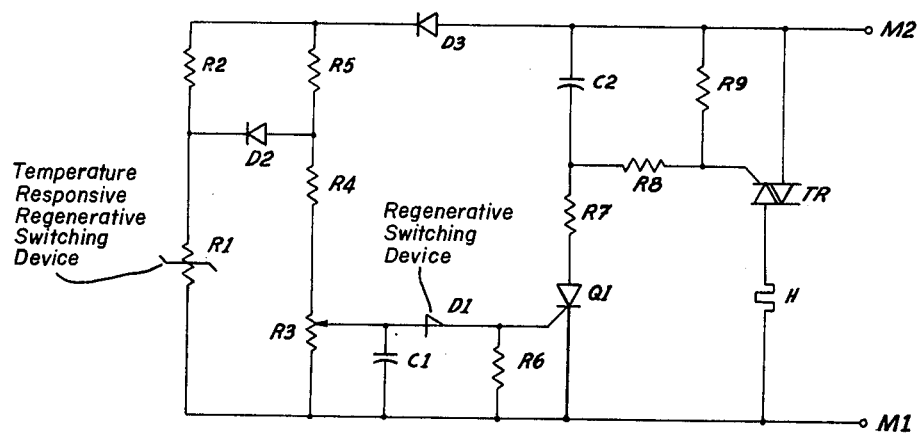
FIG. 3 illustrates a preferred embodiment of a discrimination apparatus and a specific circuitry utilizing such discrimination apparatus.

Referring to FIG. 1, there is shown a block diagram of a temperature discrimination apparatus in accordance with the invention. The circuit comprises a first switching device 10 and a second switching device 12 in parallel across a source of alternating current voltage such as a conventional 110 volts power line. The switching device 10 must show regenerative switching at an instantaneous value of line voltage which is dependent on a temperature to be sensed. The switching device 12 must also show regenerative switching but solely in response to a preselected instantaneous value of line voltage. Examples of suitable switching devices 10 are amorphous glass devices, transition metal oxides, and certain classes of negative temperature switching devices. FIG. 2 of the drawings shows the temperature dependent current-voltage characteristics of a vanadium dioxide device which is well suited for the present invention. Examples of suitable switching devices 12 are tunnel diodes, four layer switches, gas discharge devices, etc. The current-voltage characteristics of such devices are similar to any one of the current-voltage characteristics illustrated in FIG. 2 except that they are not dependent on temperature.

The switching sequence of switching devices 10 and 12 is sensed by discriminating device 14 as an indication of whether or not the temperature to be sensed has been reached and such discriminating device may be designed by well known circuitry to automatically operate a suitable temperature conditioning apparatus such as a heater, a fan, a freezer, etc.

It will be easily understood that line voltage variations will equally affect both switching devices 10 and 12 since they are connected in parallel across the line and, therefore, line voltage variations will have no affect on the temperature discriminating function, i.e., switching sequence.

It is also to be understood that switching devices 10 and 12 could be connected in series across the a.c. source since the main aspect of the invention is to feed a.c. power through both switching devices and determine which one has switched first in the a.c. cycle.

FIG. 3 illustrates a preferred embodiment of a discrimination apparatus and a specific circuitry utilizing such discrimination apparatus. Such apparatus includes a first regenerative switching device R1 which may be an amorphous glass device, a negative temperature coefficient device, or a transition metal oxide device, such as a vanadium dioxide device having temperature dependent current-voltage characteristics as illustrated in FIG. 2. Electrical energy sufficient to cause regenerative switching of device R1 is drawn through a resistor R2 from an a.c. source which is adapted for connection to terminals M1 and M2. Resistor R2 is selected to insure regenerative switching action at the lowest temperature to be sensed and at the minimum peak value of the voltage source at expected maximum voltage variations. The second regenerative switching device is silicon unilateral switch D1 the firing point of which is set by voltage divider resistor R3 in series with fixed resistors R4 and R5 connected across resistor R3 so as to insure proper operation of silicon unilateral switch D1. A diode D2 is connected between the connecting point of regenerative switching device R1 and resistor R2. Such diode D2 performs the discriminating function of the discriminating device identified by reference numeral 14 in the block diagram of FIG. 1 as it will be more clearly seen in the later part of the description. The value of resistor R3 with respect to resistor R3 and R5 is set so that, at the maximum setting of the variable tap, no excessive voltage is applied to the silicon unilateral switch D1. The value of resistor R4 is set so that D2 is reverse biased until switching device R1 switches to its low impedance state. In the preferred embodiment of the invention, the value of resistor R4 is also selected to such a value as to insure clamping of silicon unilateral switch D1 when diode D2 becomes conductive. It will be understood that the voltage across the switching device R1 during conduction of diode D2 is the voltage applied to the series combination of resistors R3 and R4. Therefore, the value of resistor R4 must be high enough so that the portion of the voltage appearing across resistor R3 due to the clamping action of switching device R1 is below the voltage required to fire the silicon unilateral switch D1.

Diode D3 is connected in series with the a.c. source to limit the portion of the a.c. cycle applied to switching device R1 and silicon unilateral switch D1 to the positive portion of the a.c. waveform. This is due to the use of diode D2 as a discriminating device and silicon unilateral switch D1 as a second switching device. Of course, when using other types of discriminating devices, and/or second switching devices, the full period of the a.c. voltage could be applied to the first and second switching devices.

The above disclosed discrimination apparatus operates as follows:

As previously mentioned, switching device R1 will show regenerative switching at a point around 90° of the a.c. waveform at the minimum temperature value of the temperature range that the discrimination circuit is designed to sense and at the minimum peak voltage of the source at expected maximum variations of the line voltage. It will be easily understood that, as the temperature to be sensed increases, the firing point will move from 90° towards 0°. Therefore, the higher the temperature to be sensed, the closer to 0° of the a.c. waveform is the switching of the switching device R1. On the other hand, the setting of the variable tap of resistor R3 determines the point in the cycle at which the silicon unilateral switch fires. When the tap is set at the upper end of resistor R3 in FIG. 3 of the drawings, the silicon unilateral switch will fire near the 0 of the a.c. waveform whereas, when the tap is set near the lower end of the resistor R3, the silicon unilateral switch will fire near the 90° of the a.c. waveform. It will therefore be seen from the above that the firing angle of the silicon unilateral switch is governed by the setting of the tap of variable resistor R3.

When the temperature to be sensed has not been reached, the resistance of switching device R1 remains high and diode D2 remains reverse biased, while silicon unilateral switch D1 will become conductive at a point of the a.c. waveform which is set by the tap of variable resistor R3 and a sharp pulse will appear across resistor R6 connected at the output of silicon unilateral switch D1. Similar action is obtained on each successive line cycle and, thus, a series of pulses will appear at the output of silicon unilateral switch D1.

When the temperature to be sensed has been reached, the switching voltage of device R1 is lowered to a point such that diode D2 becomes forward biased before silicon unilateral switch D1 can be fired. When this happens, the voltage appearing across series resistors R3 and R4 is lowered to a point such that the voltage applied to the silicon unilateral switch is insufficient to fire silicon unilateral switch and, consequently, no pulses appear across resistor R6. Diode D2, which acts as a discriminating device, therefore monitors the state of temperature sensitive switching device R1 with respect to switching device D1 which is not temperature sensitive and prevents switching device D1 from firing after desired temperature has been reached.

It is to be understood that the above disclosed discrimination apparatus is one which automatically controls firing of the switching device D1. The present invention also contemplates the case wherein such control is done by other techniques and the discrimination apparatus only provides an indication of the firing sequence of the switching devices.

The pulses appearing at the output of silicon unilateral switch D1 during conduction thereof may be used to control the operation of a temperature conditioning element such as a heater H. In the embodiment illustrated in FIG. 3, heater H is connected in series with a triac TR across terminals M1 and M2 of the a.c. source. The firing of the triac is controlled by a silicon controlled rectifier Q1 having its main electrodes connected in series with a resistor R7 and a capacitor C2 across terminals M1 and M2 of the a.c. source. The pulses appearing at the output of silicon unilateral switch D1 are applied to the gate of the silicon controlled rectifier Q1 for controlling the state of the silicon controlled rectifier. The output of the silicon controlled rectifier Q1 is applied to the gate of triac TR by a well known circuitry including the above mentioned resistor R7 and capacitor C2 and resistors R8 and R9.

Figure 4:
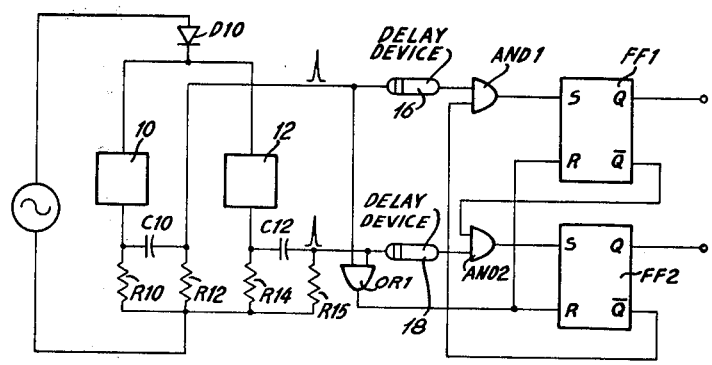
FIG. 4 illustrates a temperature discriminating device which may be used with the discrimination apparatus of FIG. 1.

It is to be understood that the above disclosed invention is not restricted to the discrimination apparatus shown in FIG. 3. FIG. 4 of the drawings illustrates an example of a discriminating device 14 which may be used for monitoring the switching sequence of switching devices 10 and 12. The discriminating device comprises two well known set-reset flip-flops FF1 and FF2 which may be set by the output of AND gates AND 1 and AND 2. Gate AND 1 has a first input connected to the output $\overline{Q}$ of flip-flop FF2 and a second input connected through a delay device 16 to a differentiating circuit including resistors R10 and R12 and capacitor C10 connected in series with switching device 10. Gate AND 2 has a first input connected to the output $\overline{Q}$ of flip-flop FF1 and a second input connected, through a delay device 18, to a second differentiating circuit including resistors R14 and R15 and capacitor $C_{12}$ connected in series with switching device 12. The flip-flop FF1 and FF2 are reset through OR gate OR1 everytime a pulse is fed to AND gates AND 1 or AND 2. Delay devices 16 and 18 are used to insure resetting of flip-flops FF1 and FF2 before they are operated by AND gates AND 1 or AND 2. Thus, when a pulse appears at the output of either one of the differentiating circuits, the output Q of flip-flops FF1 and FF2 is low and the output $\overline{Q}$ is high to open gates AND 1 and AND 2. If the first switching device to fire is switching device 10, the pulse appearing at the output of the differentiating circuit including resistors R10 and R12 and capacitor C10 will pass through gate AND 1 and change the state of flip-flop FF1 so that its output Q will turn high. Output $\overline{Q}$ of flip-flop FF1 will thus turn low and block gate AND 2 to prevent operation of flip-flop FF2 when switching device 12 is subsequently fired. On the other hand, if switching device 12 is switched on first, the pulse appearing at the output of the differentiating circuit including resistors R14 and R15 and capacitor C12 will change the state of flip-flop FF2 and its output Q will turn high. The output $\overline{Q}$ of flip-flop FF2 will thus turn low and block gate AND 1 so that the subsequent firing of switching device 10 will not change the state of flip-flop FF1. Thus, when switching device 10 is fired first, the output Q of flip-flop FF1 alone is high. On the contrary, when the switching device 12 is fired first, the output Q of flip-flop FF2 alone is high.

It is also to be understood that the application of such discrimination apparatus is not limited to the one shown in FIG. 3. The application may be to the control of any temperature conditioning devices such as heaters, fans, freezers, etc. In the case of cooling devices, it is to be understood that adequate interface circuitry would be required to control cooling in a manner which is inversely proportional to temperature increases or decreases.

I claim:

1. A temperature discrimination apparatus comprising:
   a. a first switching device exhibiting regenerative switching action at a power level which is dependent on the temperature sensed by said first switching device;
   b. a second switching device exhibiting regenerative switching action solely in response to a preselected power level;
   c. means for simultaneously applying power from an a.c. source to said first and second switching devices; and
   d. discriminating means connected to said first and second switching devices for determining if said first switching device has switched ahead of said second switching device in the cycle of the a.c. power source as the magnitude of the a.c. source increases from zero, thus providing an indication that the temperature to be sensed has been reached.

2. A temperature discrimination apparatus as defined in claim 1, wherein said discriminating means includes a digital circuit interconnecting said first and second switching devices, said digital circuit detecting the firing sequence of said first and second switching devices so as to indicate whether or not the temperature to be sensed has been reached.

3. A temperature discrimination apparatus as defined in claim 1, further comprising a resistor connected in series with said first switching device across said a.c. source, the value of said resistor being selected to insure regenerative switching action at the lowest and highest temperature to be sensed.

4. A temperature discrimination apparatus as defined in claim 1, further comprising a voltage divider connected across said a.c. source and including a variable resistor the value of which is manually set to switch said second switching device on at various preselected instantaneous values of source voltage.

5. A temperature discrimination apparatus as defined in claim 1, wherein said first and second switching devices are connected in parallel across the a.c. source and the discriminating means is a diode interconnecting the first and second switching devices and poled in such a direction so as to be reverse biased until the first switching device has switched but to become forward biased when the first switching device has switched, said diode, when becoming conductive, clamping the voltage applied to said second switching device to a value below its switching voltage thereby preventing switching of the second switching device when the first switching device is switched before the second.

6. A temperature discrimination apparatus as defined in claim 5, used for the firing of a triac connected in series with a temperature conditioning element and further comprising means responsive to said discrimination apparatus for controlling the operation of said triac.

7. A temperature discrimination apparatus as defined in claim 6, wherein said second switching device is a silicon unilateral switch and wherein said means for controlling the operation of said triac comprises a gate control circuit for firing said triac and a silicon controlled rectifier connected in said gate control circuit and having its gate connected to the output of said silicon unilateral switch.

* * * * *